US009117951B2

(12) United States Patent
Park et al.

(10) Patent No.: US 9,117,951 B2
(45) Date of Patent: Aug. 25, 2015

(54) SOLAR CELL MODULE SUPPORT STRUCTURE

(75) Inventors: Gi Ju Park, Gwangju-si (KR); Doo Yeol Park, Incheon (KR)

(73) Assignee: ENERSOLAR CO., LTD., Seoul (KR)

( * ) Notice: Subject to any disclaimer, the term of this patent is extended or adjusted under 35 U.S.C. 154(b) by 23 days.

(21) Appl. No.: 14/008,572

(22) PCT Filed: Jul. 11, 2011

(86) PCT No.: PCT/KR2011/005049
§ 371 (c)(1),
(2), (4) Date: Sep. 30, 2013

(87) PCT Pub. No.: WO2012/133991
PCT Pub. Date: Oct. 4, 2012

(65) Prior Publication Data
US 2014/0048124 A1 Feb. 20, 2014

(30) Foreign Application Priority Data

Mar. 30, 2011 (KR) .................. 10-2011-0028858
Mar. 30, 2011 (KR) .................. 10-2011-0028859

(51) Int. Cl.
*E04D 13/18* (2014.01)
*H01L 31/042* (2014.01)
*F24J 2/52* (2006.01)

(52) U.S. Cl.
CPC ............. *H01L 31/0422* (2013.01); *F24J 2/526* (2013.01); *F24J 2/5232* (2013.01); *F24J 2/5241* (2013.01);
(Continued)

(58) Field of Classification Search
CPC ......... F24J 2/5252; F24J 2/5241; F24J 2/526; F24J 2/5232; F24J 2/5264; H02S 20/30; H02S 20/32

USPC .......................................... 52/173.3; 136/251
See application file for complete search history.

(56) References Cited

U.S. PATENT DOCUMENTS 5,125,608 A * 6/1992 McMaster et al. ......... 248/163.1
8,101,849 B2 * 1/2012 Almy et al. .................... 136/246
(Continued)

FOREIGN PATENT DOCUMENTS

DE         3504133 A1 * 8/1986  .............. E04H 15/18
JP     2005-133333 A      5/2005
(Continued)

OTHER PUBLICATIONS

International Search Report in International Application No. PCT/KR2011/005049, dated Mar. 19, 2012.

*Primary Examiner* — Adriana Figueroa
(74) *Attorney, Agent, or Firm* — Park, Kim & Suh, LLC

(57) ABSTRACT

The present invention provides a solar cell module support structure comprising: a first support for a solar cell module to be received and supported; a connecting portion connected to the first support; a main frame connected to the connecting portion so as to support the solar cell module and the first support, having the connection portion mounted thereon and having a mounting groove formed along the length thereof so that the location of the connecting portion can be adjusted along the length thereof; second supports which are provided on the lower side of the main frame, support the main frame from the ground surface, are provided in a plurality, and are arranged in a separated manner from each other; and a connection wire for mutually connecting any one of the second supports with another second support.

22 Claims, 19 Drawing Sheets

(52) U.S. Cl.
CPC .............. *F24J 2/5252* (2013.01); *F24J 2/5264*
(2013.01); *H02S 20/00* (2013.01); *F24J*
*2002/5216* (2013.01); *Y02E 10/47* (2013.01);
*Y02E 10/50* (2013.01)

(56) References Cited

U.S. PATENT DOCUMENTS

| | | | |
|---|---|---|---|
| 8,212,140 B2 * | 7/2012 | Conger | 136/248 |
| 8,291,653 B2 * | 10/2012 | Suarez et al. | 52/173.3 |
| 8,413,391 B2 * | 4/2013 | Seery et al. | 52/173.3 |
| 8,550,419 B2 * | 10/2013 | Hausner et al. | 248/370 |
| 8,684,190 B2 * | 4/2014 | Abar | 211/41.1 |
| 2009/0223315 A1 * | 9/2009 | Needham | 74/471 R |
| 2010/0038507 A1 * | 2/2010 | Schwarze et al. | 248/274.1 |
| 2010/0077679 A1 * | 4/2010 | Sagayama | 52/173.3 |
| 2011/0240101 A1 * | 10/2011 | Sagayama et al. | 136/251 |
| 2012/0006317 A1 * | 1/2012 | Sade | 126/600 |

FOREIGN PATENT DOCUMENTS

| | | |
|---|---|---|
| KR | 10-2010-0121333 A | 11/2010 |
| KR | 10-1019430 A | 3/2011 |

* cited by examiner (a)

(b)

(a)

(b)

(a)

(b)

A : Meridian Transit Solar Altitude in Summer solstice
B : Meridian Transit Solar Altitude in Spring/Autumn equinox
C : Meridian Transit Solar Altitude in Winter solstice

SOLAR CELL MODULE SUPPORT STRUCTURE

CROSS-REFERENCE TO RELATED APPLICATIONS

This application is the National Stage filing under 35 U.S.C. 371 of International Application No. PCT/KR2011/005049, filed on Jul. 11, 2011, which claims the benefit of Korean Patent Application No. 10-2011-0028858, filed on Mar. 30, 2011 and Korean Patent Application No. 10-2011-0028859, filed on Mar. 30, 2011, the contents of which are all hereby incorporated by reference herein in their entirety.

TECHNICAL FIELD

The present invention relates to a solar cell module support structure, more specifically, to a solar cell module support structure of which arrangement of a solar cell can be changed easily, with a simple assembling process.

BACKGROUND

As fossil fuel such as petroleum and coal is exhausted, alternative energy is development. Especially, development of energy sources utilizing solar energy has been flourished.

Development technology using the solar energy in producing electricity includes solar power generation and photovoltaic power generation. The solar power generation uses solar heat in driving a heat engine to generate electricity. The photovoltaic power generation uses light of the sun to generate electricity from solar cell.

The solar cell used in the photovoltaic power generation includes a semiconductor compound element capable of directly converting light of the sun into electricity.

The solar cell used in the photovoltaic power generation is typically formed of silicon and composite materials. Specifically, junction between P-semiconductor and N-semiconductor is performed for the solar cell and the solar cell uses a photoelectric effect configured to produce electricity by receiving light of the sun.

Most of the solar cells are configured of large area P-N junction diodes. An electromotive force generated in each of both ends of the P-N junction diode is connected to an external circuit to be used.

The smallest unit of the solar cell is called as 'cell'. The solar cell is rarely used as it is.

While dozens or hundreds of voltages (V) are required in substantial usage, the voltage generated from one cell is approximately 0.5V which is too small. Because of that, a predetermined number of unit solar cells are connected in series or parallel to use. The number of the unit solar cells is the required unit quantity.

In addition, when they are used outside, the solar cells various are subject to harsh conditions. To protect them from the harsh conditions, the plurality of the cells as predetermined packages of cells can compose a solar cell module.

However, quite a number of solar cell modules have to be used to gain predetermined electric voltages. Because of that, an installation place of the solar cell modules is restricted. In other words, there is little problem in case the solar cell modules are installed in a building roof or outdoor facilities. However, there is a problem of difficult installation in case they are installed in an apartment building.

In a support structure for supporting the conventional solar cell module, main frames, supports for supporting the solar cell module, a supporting column for supporting the main frame with respect to the ground are generally connected by welding. Once the positions of the components are fixed and welded, it is difficult to change the arrangement of the components.

Especially, a fixed type support structure for supporting a large number of solar cell modules has a fixed arrangement angle. The arrangement angle of the solar cell modules is restrictedly adjusted as the solar altitude is changed by change of the solar term. Accordingly, the conventional solar cell module support structure has problems of low light collection efficiency and low electricity production efficiency.

Specifically, the meridian transit altitude is approximately 52° in the vernal or autumnal equinox of the 24 divisions of the year in the lunar calendar, considering our country, Korea. The meridian transit altitude is approximately 75.5° in the summer solstice and 28.5° in the winter solstice.

However, the conventional solar cell modules are arranged with a fixed slope facing south and they have a problem of a large deviation in the electricity generation quantity.

DISCLOSURE

Technical Problem

To solve the problems, an object of the present invention is to provide a solar cell module support structure that can change arrangement of solar cell modules easily.

Another object of the present invention is to provide a solar cell module support structure that can adjust an arrangement angle of a solar cell module with respect to a horizontal plane according to change of the solar altitude flexibly and easily.

Technical Solution

To achieve these objects and other advantages and in accordance with the purpose of the embodiments, as embodied and broadly described herein, a solar cell module support structure includes a first support seating a solar cell module therein to support; a connection part connected to the first support; a main frame connected to the connection part to support the solar cell module and the first support, the main frame comprising an installation groove formed along a longitudinal direction to install the connection part herein to adjust a position of the connection part along a longitudinal direction; a second support provided in a lower portion of the main frame, a plurality of second supports spaced apart a predetermined distance from each other; and a connection wire connecting one second support with another second support.

Advantageous Effects

The embodiments have following advantageous effects. According to the present invention, the position of the solar cell module may be changed easily by the solar cell module support structure.

Specifically, the back and force movement of the solar cell module may be smoothly adjusted along the main frame of the solar cell module support structure, to adjust the gap with another solar cell module. Accordingly, ventilation efficiency can be enhanced and integration efficiency of the solar cell modules can be enhanced.

Meanwhile, the height of the solar cell module and the arrangement angle of the solar cell module with respect to the horizontal plate may be adjusted efficiently according to change of seasons. Accordingly, light collection efficiency and electricity production efficiency according to season change may be enhanced.

Deviations of the electricity production amount for each season can be reduced advantageously.

Also, the components provided in the present invention may be assembled by bolt fastening, not by the welding connection. Accordingly, assembling efficiency cam be increased and it can be easy to keep and maintain the solar cell module support structure according to the present invention.

Meanwhile, the wirings connected to the solar cell modules are arranged in the supports supporting the solar cell modules, not in an auxiliary duct. Accordingly, spatial utility and cost reduction can be accomplished.

BEST MODE

As follows, embodiments of the present invention will be described in detail, referring to the accompanying drawings.

Reference may now be made in detail to specific embodiments, examples of which may be illustrated in the accompanying drawings. Wherever possible, same reference numbers may be used throughout the drawings to refer to the same or like parts.

Figure 1:
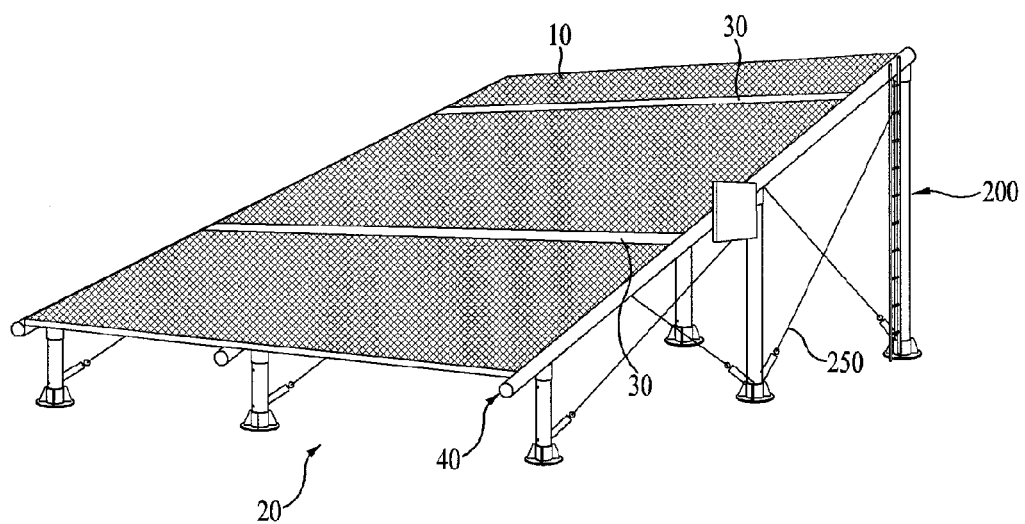
FIG. 1 is a diagram of a solar cell module and a solar cell module support structure according to a first embodiment of the present invention.

FIG. 1 is a diagram a solar cell module 10 and a support structure supporting the solar cell module (hereinafter, a solar cell module support structure) according to a first embodiment of the present invention.

Here, the solar cell module 10 is a plate type and a plurality of solar cell modules may be arranged. A foothold for checking 30 is provided between one solar cell module 10 and another neighboring solar cell module 10.

The solar cell module support structure 40 includes a main frame 40 arranged in a back-and-forth direction thereof, a first support 100 supporting the solar cell module 10 to the main frame 40, and a second support 200 arranged between the main frame 40 and the ground.

The second support 200 may be perpendicular column-shaped.

The main frame 40 is formed in a pipe shape extended in the back-and-forth direction. A plurality of main frames may be provided, spaced apart a predetermined distance from each other in a right and left direction.

The solar cell module 10 may be tilted upward from a front portion to a back portion, to collect light of the sun efficiently.

Accordingly, the second support 200 may be also getting higher from a front portion to a rear portion.

Also, s plurality of second supports 200 may be arranged in back-and-forth direction and right-and-left directions, corresponding to the arranged position of the main frame 40. One of the second supports 200 is connected with another one by an auxiliary supporting material such as a connection wire 250.

Accordingly, one of the second supports 200 is supported by another one and the second supports 200 may be prevented of shaking in a right-and-left direction.

Figure 2:
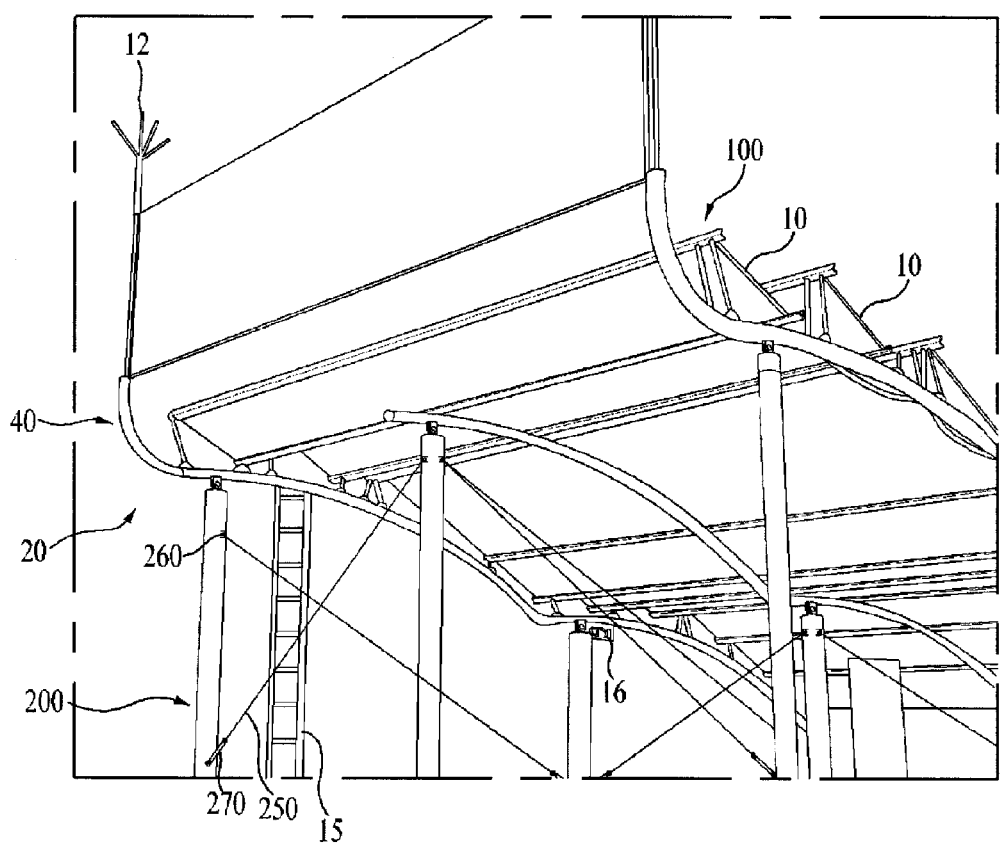
FIG. 2 is a diagram of a solar cell module and a solar cell module support structure according to a second embodiment of the present invention.

FIG. 2 is a diagram illustrating the solar cell module 10 supported by the solar cell module support structure 40 according to another embodiment of the present invention.

The solar cell modules 10 are arranged in a right and left direction in a plurality of columns.

In this instance, the columns of the solar cell modules 10 are spaced apart a predetermined distance from each other and a predetermined space is provided in the distance between each two of the columns.

Such a space is functioned as an air vent to pass air there through smoothly and the space prevents arrangement of the solar cell module 10 from being changed by wind pressure.

In FIG. 2, the main frame 40 is extended in a vertical direction and both of the main frame 40 and the solar cell module 10 are supported by the first support 100.

The first support 100 is arranged between the solar cell module 10 and the main frame 40.

The second support 200 is provided underneath the main frame 40, in a vertical column shape. The second support 200 is connected to the ground and it supports the main frame 40.

A lightning rod 12 to prevent lightning, an illuminance sensor (not shown) and the like are provided in the main frame 40, rather than the solar cell module 10. Also, a ladder for checking 15 and a sign 16 may be installed in the main frame 40 to enable user maintenance.

The second supports 200 are connected with each other by a connection wire 250, to form a mutual supporting structure.

The length of the connection wire 250 is adjustable and the connection wire 250 can be flexibly extendible according to the distance between the second supports 200.

The connection wire 250 may be connected to an eyebolt, a wire connecting portion 260 such as an eyebolt and a wire tension adjusting member 270 such as a turn-buckle provided in each of the second supports 200.

The tension of the connection wire may be adjustable by wire tension adjusting member 270 such as the turn buckle.

The main frame 40 may be getting lower from a rear portion to a front portion thereof, with a predetermined curvature not a linear shape getting lower from a rear portion to a front portion.

That is to maximize the amount of light collection and power generation, because the arrangement angle of the solar cell module 10 is differentiated in each column.

A rear portion of the solar cell module 10 arranged in each column is higher than a front portion, to be tilted.

A rear portion of a solar cell module 10 arranged in a front column may be higher than a front portion of a solar cell module 10 arranged in a rear column.

That is to install more solar cell modules 10 in the limited space and to provide the air vent simultaneously.

Figure 3:
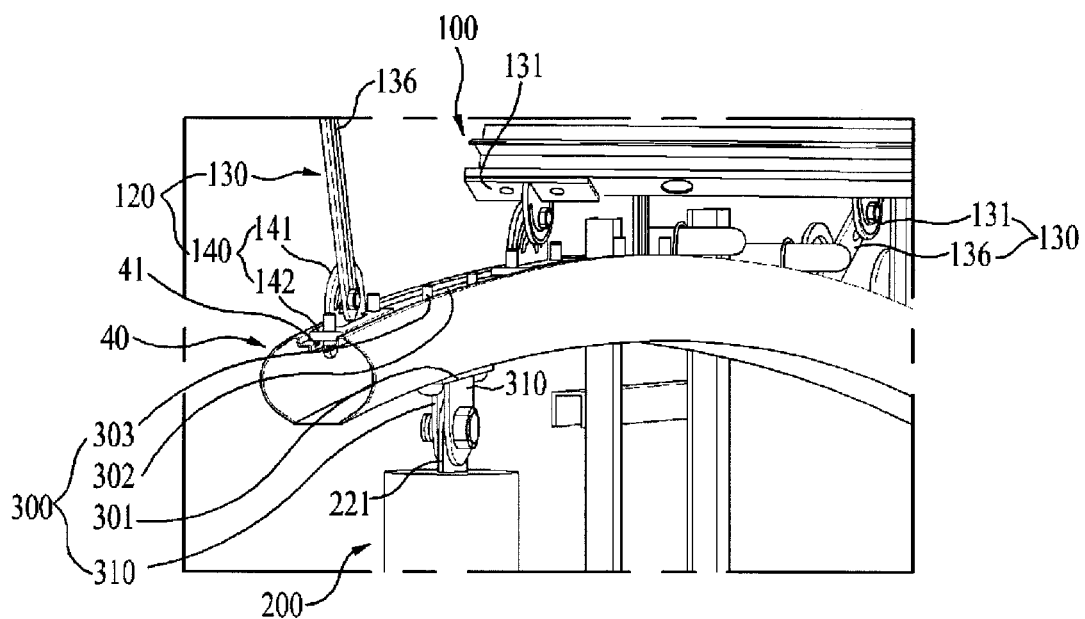
FIG. 3 is a perspective view partially illustrating the support structure.

FIG. 3 is a perspective illustrating a coupling state of the main frame 40 with respect to the first support 100 and the second supports.

The main frame 40 is provided in a hollow pipe. The first support 100 and the connection part 120 connected to the first support 100 are provided on the main frame 40.

The second supports 200 are positioned underneath the main frame 40.

An installation groove 41 is provided in a top surface of the main frame 40. The installation groove 41 may have a predetermined length along a longitudinal direction of the main frame 40.

That is to install the connection part 120 along the vertical direction of the main frame 40 easily.

Specifically, that is to install the connection part 120 along the longitudinal direction of the main frame 40 freely at a predetermined position fitted to a worker's intension.

The first support 100 may be provided in an angle shape capable of supporting the solar cell module 10.

The connection part 120 includes an upper connection member 130 connected to the first support 100 and a lower connection member 140 connected to the upper connection member to be arranged in the installation groove 41 of the main frame 40.

The upper connection member 130 includes a bracket 131 coupled to the first support 0100 and a connecting bar 136 connected to the bracket 131.

Here, the connecting part 136 is a relatively thin strip type formed of a metallic material.

The connecting bar 136 may be installed between the bracket 131 and the lower connection member 136 or the bracket 131 may be directly installed in the lower connection member 140.

Accordingly, the connecting bar 136 may be used to install the solar cell module 10 relatively high. The bracket 131 may be directly connected to the lower connection member 140 to install the solar cell module 10 relatively low.

A plurality of connection parts 120 may be provided along a longitudinal direction of the main frame 40, spaced apart a predetermined distance from each other.

Meanwhile, the second supports 200 are provided underneath the main frame 40. The second supports 200 and a bottom surface of the main frame 40 are coupled to each other by a coupling part 300.

In this instance, the coupling part 300 includes two coupling plates 301 spaced apart a predetermined distance from each other. An extended portion 221 is inserted between the two coupling plates 301, extended from a top surface of the second supports 200 upward.

The coupling plates 301 and the extended portion 221 are fastened to each other by a fastening member such as a screw or a nut.

The coupling part 300 includes a first coupling portion 301 connected the two coupling plates 310 to couple a bottom surface of the main frame thereto, a second coupling portion 302 coupled to a top surface of the main frame 40, and a coupling bolt 303 connecting the first and second coupling portions 301 and 302 to each other, passing through the main frame 40 from a top to a bottom of the main frame 40.

Figure 4:
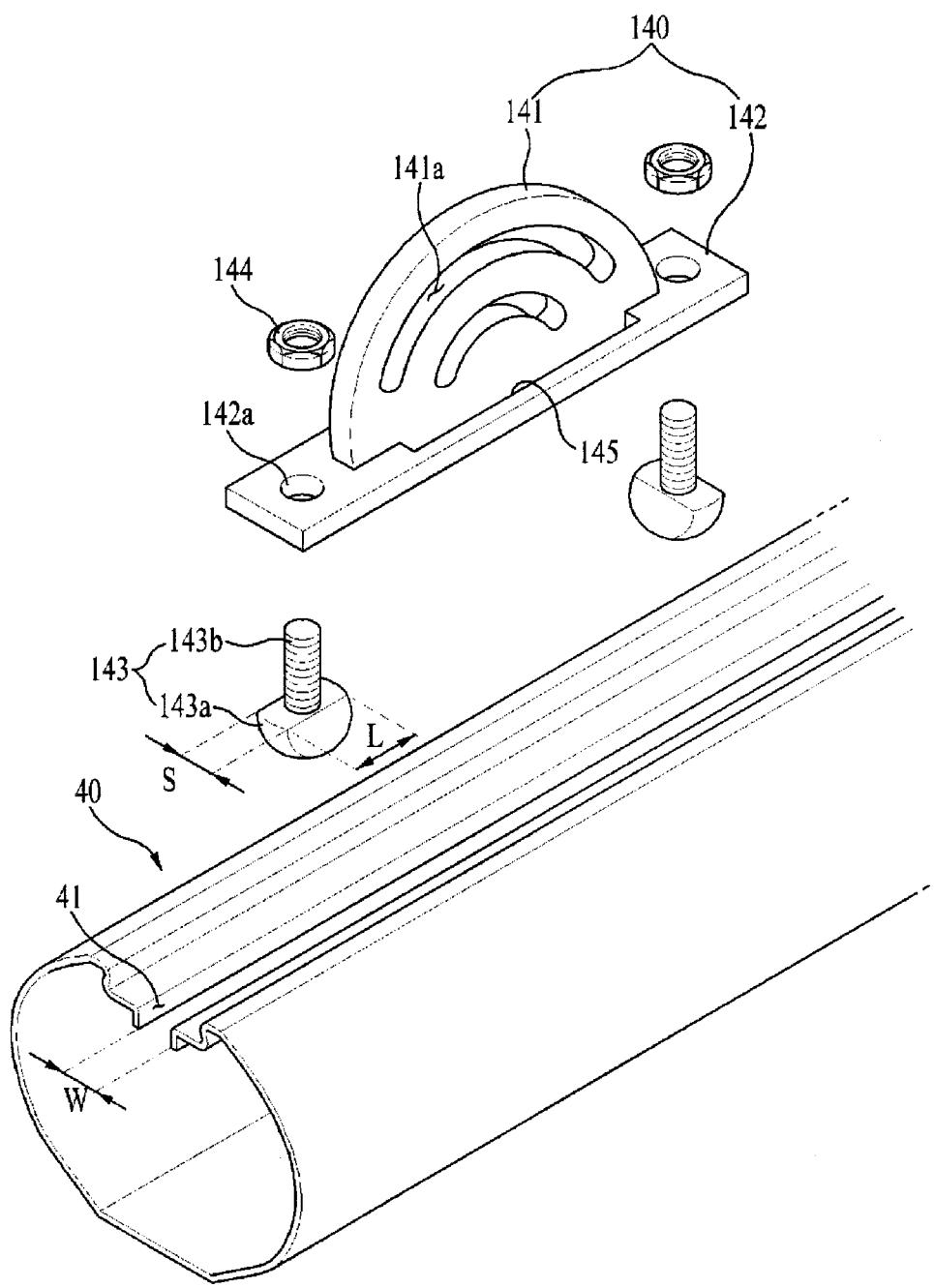
FIG. 4 is an exploded perspective view of a lower supporting member of a connection part with respect to the support structure.

Meanwhile, as shown in FIG. 4, the lower connection member 140 may include a body portion 141 connected to the connecting bar 136 by a predetermined fastening member and a seated portion 142 provided in a lower portion of the body portion to seat the main frame 40 therein.

A coupling hole 142a is provided in each end of the seated portion 142. The coupling hole 142a couple the seated portion 142 to the installation groove 41 of the main frame 40.

A through hole 143 is provided between the coupling holes 142a of the seated portion 142 to pass the connecting bar (136, see FIG. 3) there through, such that the connecting bar 136 may move downwardly through the through hole 143.

The fastening member 143 for fastening the seated portion 142 to the installation groove 41 of the main frame 40 may be a bolt.

The fastening member 143 may include a head 143a and a screw thread 143b.

A cross section of the head 143a is longitudinally extended in both directions, not in a circular shape.

A longer width (L) of the cross section possessed by the head 143a is longer than the width (W) of the installation groove 41.

Meanwhile, the shorter width (S) of the cross section possessed by the head 143a is shorter than the width (D) of the installation groove 41.

Figure 5:
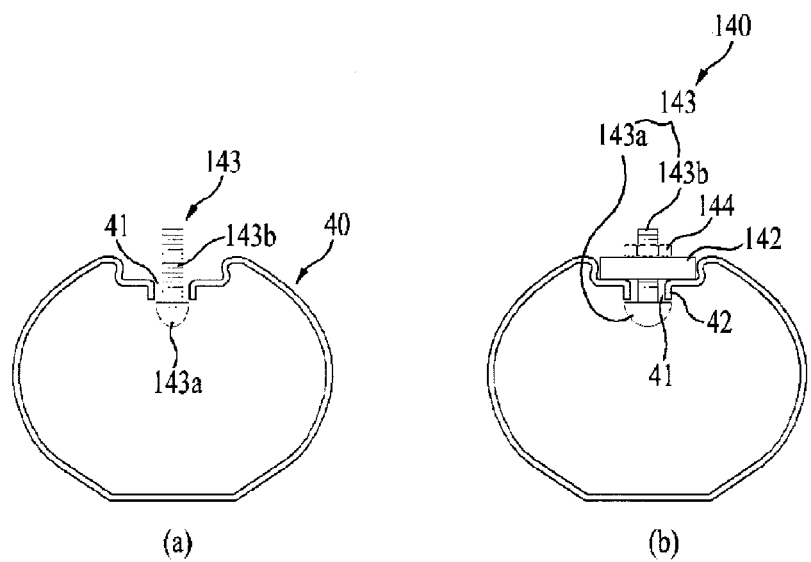
FIG. 5 is a sectional view of the lower supporting member coupled to a main frame in the support structure according to the present invention.

As shown in FIG. 5(a), before the lower connection member 140 is fastened to the main frame 40, the head 143a of the fastening member 143 is inserted in the installation groove 41.

In this instance, the head 143a is not in a circumference of the installation groove 41.

When the fastening member 143 is rotated a predetermined angle (for example, 90°) in that state, both ends of the head 143a are supportedly fastened to a lower circumference of the installation groove 41.

A projected portion 42 projected from the circumference of the installation groove 41 downward is further provided. The projected portion 42 is supportedly in contact with both ends of the head 143a.

The seated portion 142 and the nut 144 are fastened to the screw thread 143b sequentially. After that, the nut 144 is fastened and the circumference of the installation groove 41 is fixedly positioned between the head 143a and the seated portion 142.

Accordingly, the lower connection member 40 may be fastened to the main frame 40.

If an assembling process worker tries to adjust a vertical position of the lower connection member 40, the process mentioned above is performed in the reverse order. The fastening between the main frame 40 and the lower connection member 140 is released and the position is determined and adjusted. After that, the assembling process mentioned above is performed.

Figure 6:
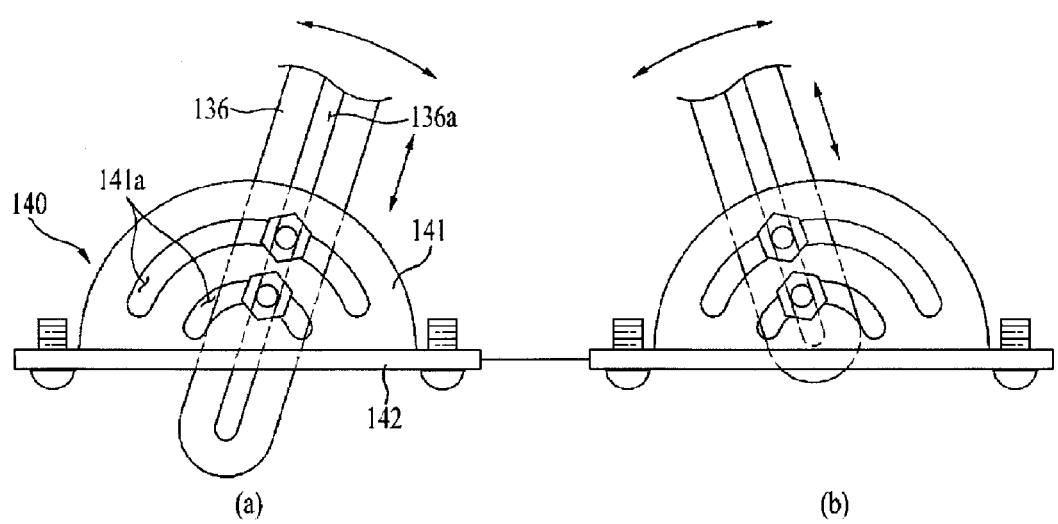
FIG. 6 is a side view of the connection part composing the support structure.

FIG. 6 is a side view illustrating the connecting bar 136 composing the upper connection member (130, see FIG. 3)

and the lower connection member 140. A hollow portion 136a is formed in the connecting bar 136 along a longitudinal direction.

The body portion 141 of the lower connection member 140 may be provided in a semicircular shape. An arc-shaped guide groove 141a is provided in the body portion 141. A plurality of guide grooves 141a may be arranged in a plurality of columns.

The body portion 141 of the lower connection member 140 is fastened with the connecting bar 136 by a fastening member such as a bolt or a nut. At this time, such a bolt passes through the guide grooves 141a and the hollow portion 136a, to fasten them with each other.

As shown in FIG. 6(a), after the arrangement height of the connecting bar 136 is adjusted by moving the connection bar upwardly and downwardly, the connecting bar 136 and the lower connection member 140 may be fastened to each other by the fastening member.

At this time, relative position change is generated between the fastening member and the hollow portion 136a, such that the height of the solar cell module (10, see FIG. 2) supported by the connecting bar 136 may be adjusted.

Meanwhile, as shown in FIG. 6(b), after the arrangement angle of the connecting bar 136 is adjusted by rotating the connection bar in a front to rear direction, the connecting bar 136 and the lower connection member 140 may be fastened to each other.

That is to generate the relative position change between the fastening member and the guide grooves 141a. Accordingly, the arrangement angle of the solar cell module supported by the connecting bar 136 may be adjusted with respect to the ground.

Meanwhile, the reason why the plurality of the guide grooves 141a are provided is that the fastening of the fastening member has to be performed firmly after the arrangement angle of the connecting bar 136 is adjusted.

Figure 7:
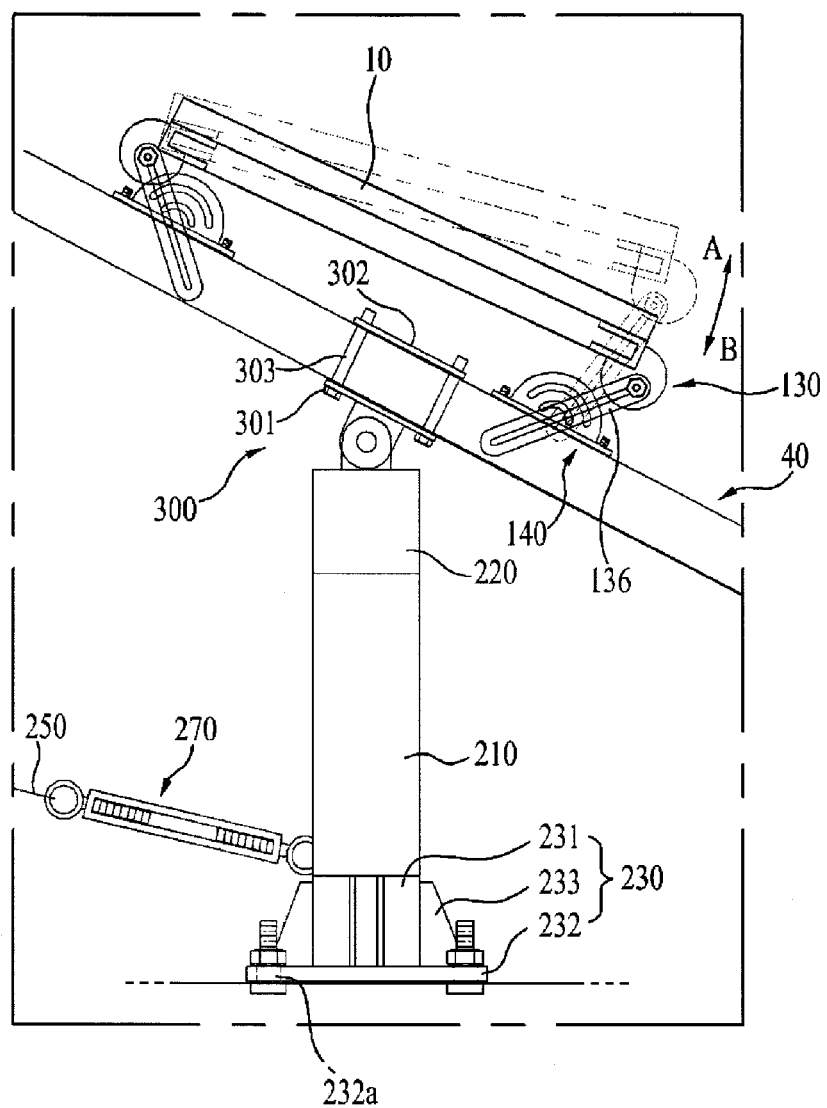
FIG. 7 is a side view of the support structure.

FIG. 7 is a diagram illustrating front and rear portions of one solar cell module that are supported by the first support, the connection part, the main frame, the fastening part and the second support.

A front end and a rear end of the solar cell module 10 may be supported by the first support 100.

The first support 100 is connected to the connection part 120, in other words, the upper connection member 130 and the lower connection member 140, to support the main frame 40.

The upper connection member 130 includes the connecting bar 136 and the bracket 136 fastened to the first support 100.

The hollow portion 136a is formed in the connecting bar 136 along the longitudinal direction.

The body portion 141 of the lower connection member 140 may be provided in a semicircular shape. The arc-shaped guide groove 141a is provided in the body portion 141. The plurality of the guide grooves 141 may be provided in columns.

The body portion 141 of the lower connection member 140 is fastened to the connecting bar 136 by the fastening member such as a bolt. At this time, the bolt passes through the guide groove 141a and the hollow portion 136a, to fasten the lower connection member 140 and the connecting bar 136 to each other.

After the arrangement height of the connecting bar 136 is adjusted by moving the connecting bar 136 vertically, the connecting bar 136 and the lower connection member 140 may be fastened by the fastening member.

At this time, the relative position change is generated between the fastening member and the hollow portion 136a such that the height of the solar cell module 10 supported by the connecting bar 136 may be adjusted.

Meanwhile, after the arrangement angle of the connecting bar 136 is adjusted by rotating the connecting bar 136, the connecting bar 136 and the lower connection member 140 may be coupled to each other.

That is to generate the relative position change between the fastening member and the guide groove 141. Accordingly, the arrangement angle of the solar cell module 10 supported by the connecting bar 136 with respect to the ground can be adjusted.

Meanwhile, the reason why the plurality of the guide grooves 141a are provided is that the coupling enabled by the fastening member has to be performed more firmly after the arrangement angle of the connecting bar 136 is adjusted.

The second support 200 is provided under the main frame 40. The second support 200 and the main frame 40 are supported by the coupling part 300.

The coupling part 300 includes a first coupling portion 301 and a second coupling portion 302 and a second coupling portion 302. The first coupling portion 301 is provided in a bottom surface of the main frame 40 and the second coupling portion 302 is provided in a top surface of the main frame 40.

The second coupling portion 302 may be installed in the installation groove (41, see FIG. 3) or other portions rather than the installation groove 41.

The first and second coupling portions 301 and 302 are fastened by a fastening bolt 303. The fastening bolt 303 passes through the main frame 40 vertically, to connect the first and second coupling portions to each other.

In this instance, the coupling part 300 is provided between the connection parts 120, to transmit the load of the solar cell module 10 applied to the connection parts 120 to the second support 200.

Meanwhile, one of the second supports 200 is connected to the other one by the connection wire 250. The connection wire 250 may be connected to the wire tension adjusting member 270 such as a turn buckle.

Figure 13:
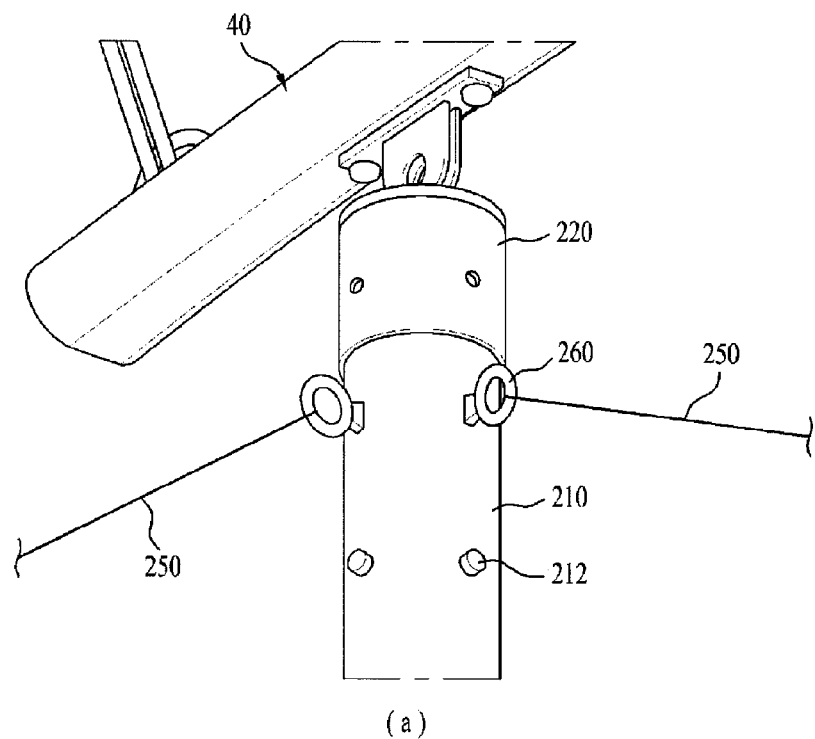
FIG. 13 is a perspective view illustrating a wire connected to a wire connecting part of the support structure.
Figure 13:
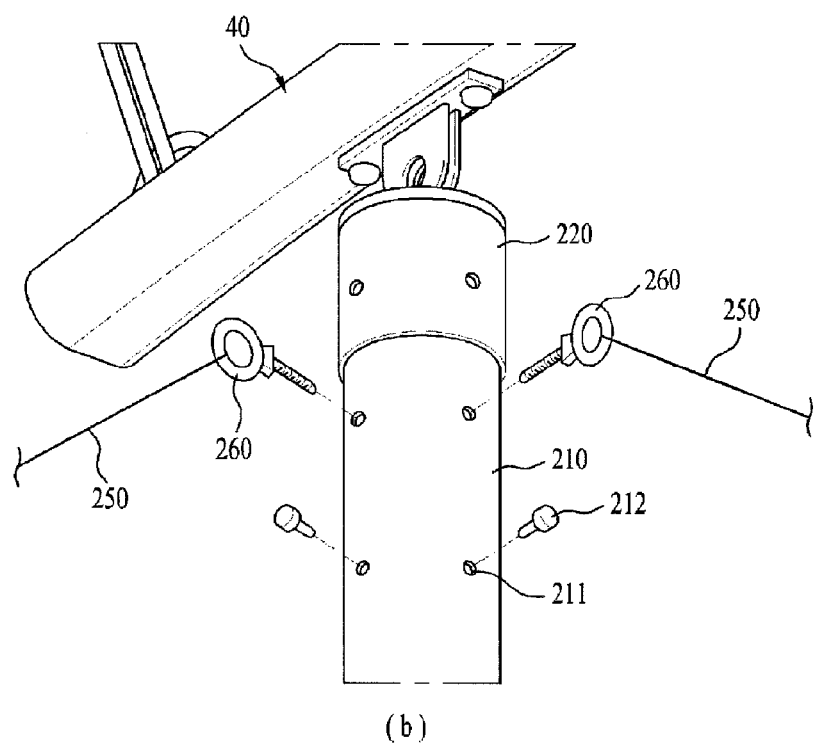

Meanwhile, the other second support is connected to the second support by a wire connection portion (260, see FIG. 13) such as an eye nut or an eye bolt.

A numeral reference '270' refers to a turn buckle and a numeral reference '260' refers to an eye nut or an eye bolt.

The turn buckle 270 may be provided in a lower portion of a circumferential surface of the second support 200. The eye bolt (or the eye nut 260, see FIG. 9) may be provided an upper portion of an outer circumferential surface of the second support 200.

After the coupling between the lower connection member 140 and the connecting bar 136 is released in a state of fixing the solar cell module 10 supportedly, the connecting bar 136 is lifted and fixed again and the height or arrangement angle of the solar cell module 10 is changed in comparison to the prior height or angle.

The reason why the height or arrangement angle of the solar cell module 10 is adjusted is that the solar altitude is changed in winter, summer and spring/autumn.

Accordingly, to adjust an optimized light collection position in consideration of the solar altitude, it is necessary to adjust the arrangement angle and height of the solar cell module 10 by changing the assembling state of the connection part.

Figure 8:
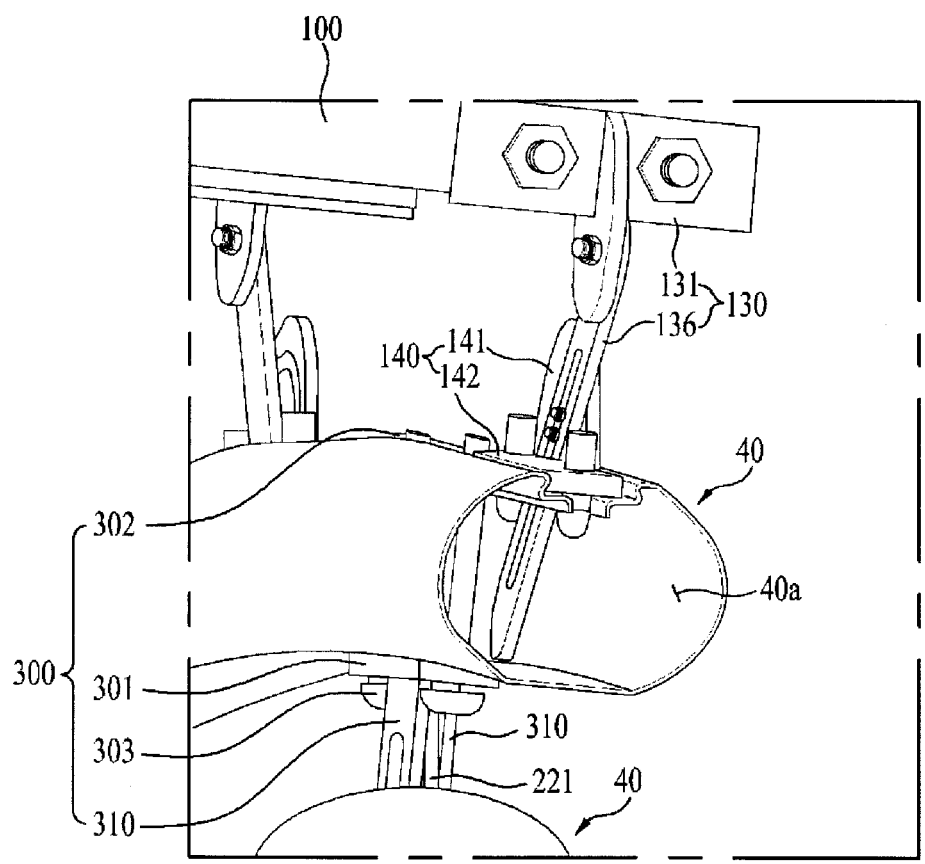
FIG. 8 is a perspective view illustrating a connection bar of the support structure is accommodated by the main frame after moved down.

As shown in FIG. 8, the upper connection member 130 is connected to the lower connection member 140 installed in the main frame 40, only to support the solar cell module 10.

At this time, when the connecting bar 146 is dropped to lower the solar cell module 10, a lower end of the connecting bar 136 is partially inserted in the hollow portion of the main frame 40.

The inside of the main frame 40 is hollow, to give the connecting bar 136 freedom to move vertically.

Meanwhile, the first and second coupling portions 301 and 302 are fastened by the fastening bolt 303. The fastening bolt 303 passes through the main frame 40 vertically to connect them to each other.

For the fastening convenience of the first coupling portion 301, a bottom surface of the main frame 40 may be partially level.

Figure 9:
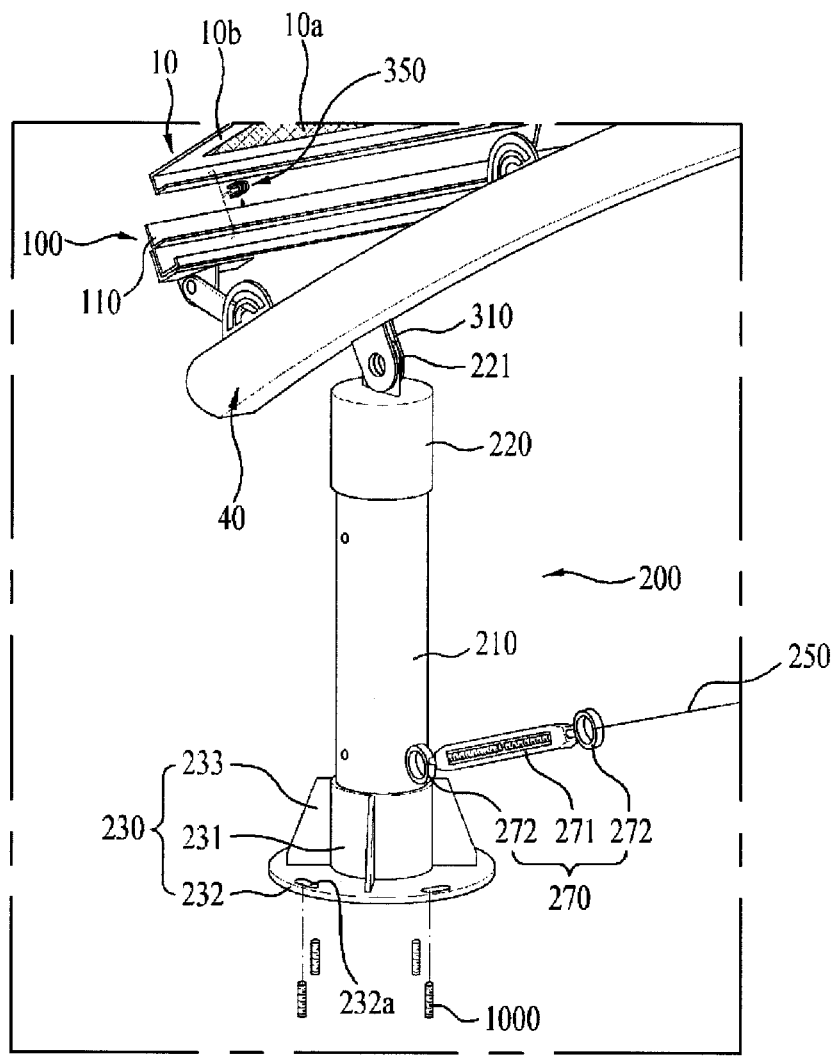
FIG. 9 is an exploded perspective view illustrating a supported state of the support structure with respect to the ground.

As shown in FIG. 9, the solar cell module 10 is provided with a solar cell plate 10a and a protection frame 10b covering a circumference of the solar cell plate 10a, the protection frame 10b is seated in the first support 100 formed in an angle shape and the solar cell module 10 is coupled to the first support by the fixing part 350 for fixing the protection frame 10b to the first support 100 partially and simultaneously.

Specifically, a supporting protrusion 110 formed in a shape of 'ㄴ' shape is provided in the first support 100. One supporting protrusion 110 supporting an end of the solar cell module 110 may be arranged to face the other supporting protrusion 110 supporting the other end of the solar cell module 10.

When the solar cell module 10 is seated in the first support 100 in that state, the protection frame 10b is supportedly seated in each of the supporting protrusions 110.

The fixing part 350 make the supporting protrusion 110 and the protection frame 10b fixedly surface-contact with each other, with covering rims of them.

Specifically, in a state where the 'ㄷ'-shaped protection frame 10b is seated on the 'ㄴ'-shaped supporting protrusion 110, the fixing part (formed in a 'ㄷ' or 'ᄀ' shape) is coupled to an end of the supporting protrusion 110 and an end of the protection frame 10b to fix the supporting protrusion 110 and the protection frame 10b.

Meanwhile, the coupling part 300 and the second supports 200 provided in the lower portion of the main frame 40 will be described as follows.

The coupling part 300 is coupled to the lower portion of the main frame 40. As mentioned above, the coupling part 300 includes the first coupling portion 301 coupled to the bottom surface of the main frame 40 and the second coupling portion 302 coupled to the top surface of the main frame 40.

A coupling plate 301 extended downward is provided in the first coupling portion 301. The coupling plate 310 includes a first coupling plate and a second coupling plate spaced apart a predetermined distance from each other.

The extended portion 221 of the second support 200 is inserted between the coupling plates 310.

The extended portion 221 inserted between the coupling plates 310 is fixed by a predetermined fastening member.

The second support 300 is divided into three portions. Such three portions include a column portion 210 connected with the connection wire 250, an upper support portion 210 provided in an upper portion of the column portion 210 to be coupled to the coupling part 300, and a lower support portion 230 provided in a lower portion of the column portion 210 to be connected to an anchor bolt 1000 provided on the ground.

The upper support portion 220 is a cover type covering a top of the column portion 210 and the extended portion 221 is provided in a top surface of the upper support portion 220 in a plate shape.

As mentioned above, the coupling plate 310 is coupled to the extended portion 221 and the coupling part 300 is coupled to the second support 200 accordingly, such that the main frame 40 may be connected to the second support 200.

As the main frame 40, the coupling part 300 and the second support 200 are connected with each other by the fastening member, a much easier assembling process can be performed in comparison with the conventional welding connection.

The column portion 210 is cylindrical-shaped in the drawing and the present invention is not limited thereto.

The lower support portion 230 is provided in the lower portion of the column portion 210.

The lower support portion 230 includes an external cover 231 covering an outer circumferential bottom of the column portion 210, a bottom plate 232 provided in a lower portion of the external cover 231 to be coupled to the anchor bolt 1000, and a strength reinforcing plate 233 connecting an outer circumferential surface of the external cover 231 and the bottom plate 232 with each other to reinforce the strength.

A coupling hole 232a is provided in the bottom plate 232 to insert the anchor bolt 1000 therein.

Accordingly, when a nut is fastened to the anchor bolt 100 after the anchor bolt 1000 is inserted in the coupling hole 232a, the coupling between the anchor bolt 100 and the second support 200 is completed.

Figure 10:
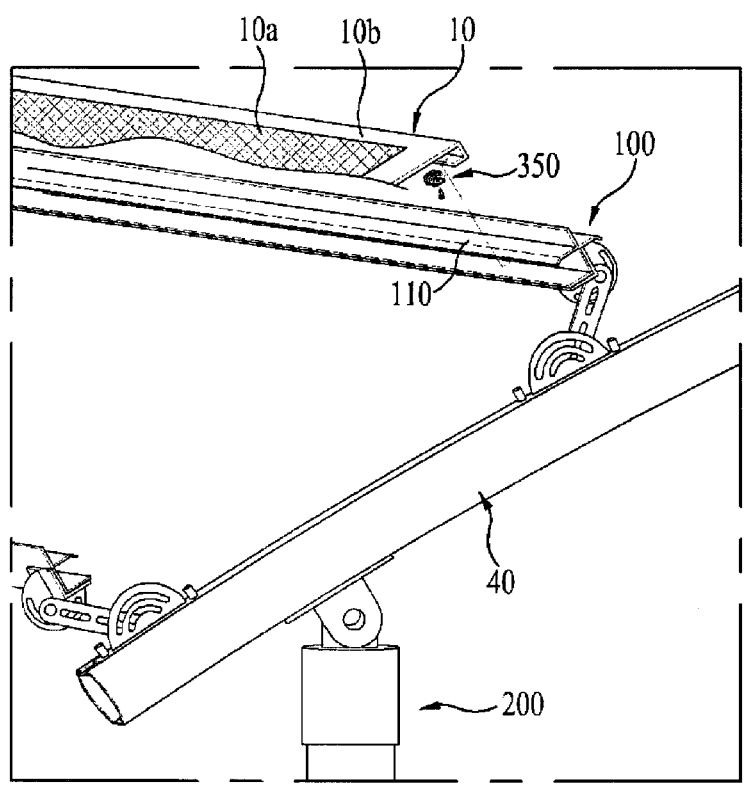
FIG. 10 is an exploded perspective view illustrating a fixing part fixing the support structure and the solar cell module.

FIG. 10 is a diagram illustrating the solar cell module 10 supported by the first support 100.

The solar cell module 10 consists of the solar cell plate 10a and the protection frame 10b covering a rim of the solar cell plate 10a.

The protection frame 10b is seated in the first support 100 formed in an angle shape and the protection frame 10b and a predetermined portion of the first support 100 are fixed by the fixing part, to coupled the first support 100 and the solar cell module 100 to each other.

Specifically, the supporting protrusion 110 formed in 'ㄴ' shape is provided in the first support 100 and the supporting protrusion 110 supporting the end of the solar cell module 10 is arranged to face the supporting protrusion 110 supporting the other end of the solar cell module 10.

In that state, the solar cell module 10 is seated in the first support 100 and the protection frame 10b supportedly is seated in each of the supporting protrusions 110.

Hence, the fixing part 300 makes the supporting protrusions 110 and the protection frame fix and surface-contact with each other, with covering them.

In other words, Specifically, in a state where the 'ㄷ'-shaped protection frame 10b is seated on the 'ㄴ'-shaped supporting protrusion 110, the fixing part (formed in a 'ㄷ' or 'ᄀ' shape) is coupled to an end of the supporting protrusion 110 and an end of the protection frame 10b to fix the supporting protrusion 110 and the protection frame 10b.

Figure 11:
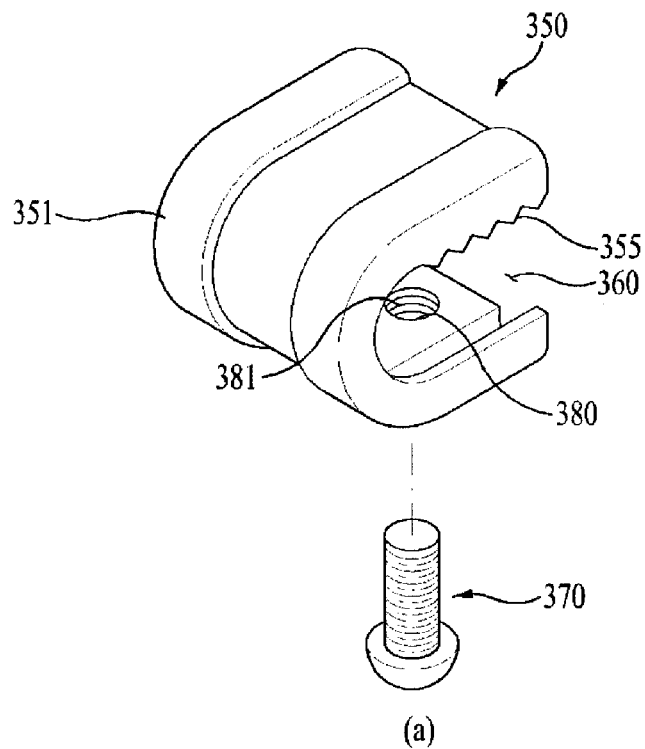
FIG. 11 is a perspective view and a side sectional view of the fixing part.
Figure 11:
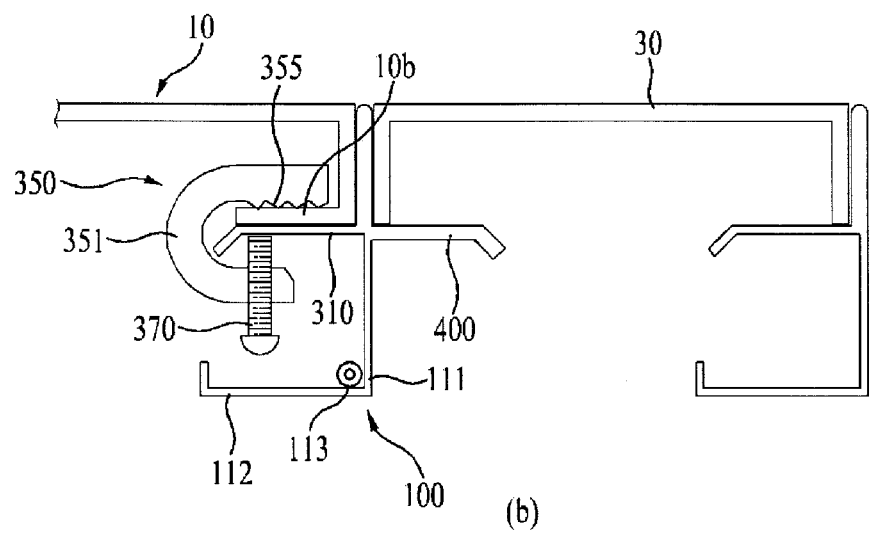

As shown in FIG. 11(a), the configuration of the fixing part has the 'ㄷ' shape or the 'ᄀ' shape.

The fixing part 300 includes a space 310 accommodating the rime of the protection frame (10b, see FIG. 10) and the rim of the supporting protrusion (110, see FIG. 10), and a fixing bolt 320 screw-fastened to a lower portion of the body portion 301.

An inserting hole 330 is provided in the lower portion of the body portion to insert the fixing bolt 320 therein and a female screw thread is arranged is arranged in an inner circumferential surface of the inserting hole 330.

When it is inserted and rotated in the inserting hole 330, the fixing bolt 320 may be fixed to the body portion 301 and an end of the fixing bolt 320 may be inserted in the space 310.

The body portion 301 is formed of a metallic piece bent in the 'ㄷ' shape, with a predetermined thickness.

A top surface of the rim of the protection frame 10b surface-contacts with a top lower surface of the body portion 301 and the supporting protrusion 110 surface-contacts with a lower circumferential surface of the protection frame 10b.

Meanwhile, the fixing bolt 320 passes through the lower portion of the body 301 and an upper end of the fixing bolt 320 is in surface-contact with a bottom surface of the supporting protrusion 110.

Accordingly, the protection frame 10b and the supporting protrusion 110 are position between the top lower surface of the body portion 301 and the upper end of the fixing bolt 320. As the fixing bolt 320 is rotated to move the upper end thereof upward, the protection frame 10b and the supporting protrusion 110 are pressed fixedly.

Meanwhile, a projection portion 305 having a sawtooth shape may be provided in a lower surface of the top of the body portion 301, to contact with a top rim surface of the protection frame 10b.

That is to prevent slip generated between the protection frame and the top lower surface of the body portion. Accordingly, as the fixing bolt is fastened, the projected portion applies the pressure to the rim of the protection frame, to prevent the protection frame from separating from the body portion.

Meanwhile, the foothold supporting part 400 is provided in an opposite position of the supporting protrusion 110 to put the foothold for checking thereon. Here, the foothold supporting part 400 is also provided in a ' ∟ ' shape and the foothold 30 formed in ' ⊓ ' shape is provided on the foothold for checking 30.

The first support 100 includes a perpendicular wall 111 having the supporting protrusion 110 and the foothold supporting part 400 arranged thereon. The bracket (136, see FIG. 3) may be fixedly fastened to the perpendicular wall 111 by a fastening member such as a screw.

Meanwhile, a wire supporting portion 112 is provided under the supporting protrusion 110, with a similar shape to the shape of the supporting protrusion 110. The wire supporting portion 112 is employed to support an electric wiring 113 connected to the solar cell module 10.

In the conventional solar cell module support structure, an auxiliary electric wiring duct independent from a support for supporting the solar cell module 10 may be provided to accommodate or arrange the electric wiring 113.

However, the wire supporting portion 112 is provided in the present invention to support the electric wiring. The first support 100 supports the solar cell module 10 and the electric wiring simultaneously.

Figure 12:
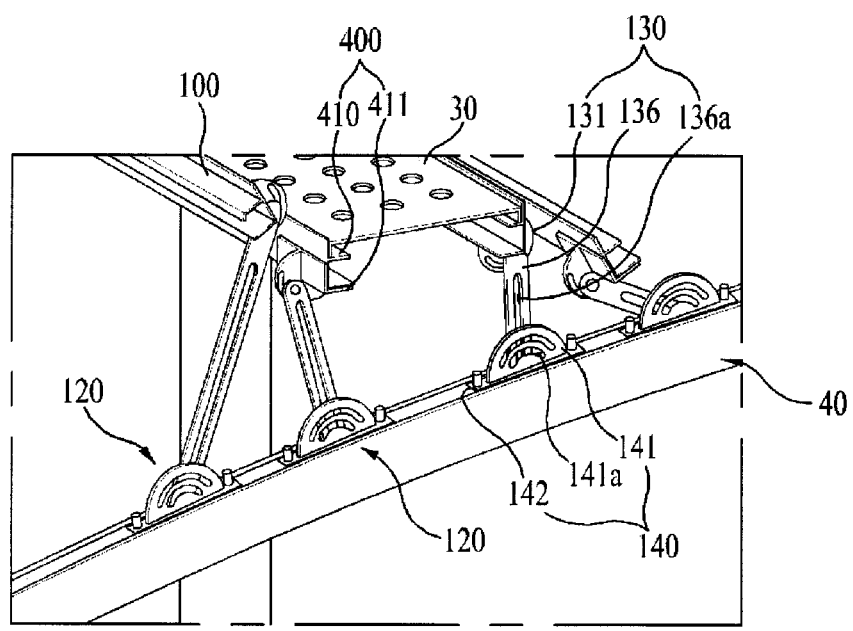
FIG. 12 is a perspective view illustrating a foothold for checking and a foothold supporting part provided in the support structure.

FIG. 12 is a perspective view illustrating the configuration of the foothold supporting part 400 for supporting the foothold for checking 30.

FIG. 11(b) shows that the first support 100 and the foothold supporting part are integrally formed with each other. However, FIG. 12 shows that the foothold supporting part 400 is separately provided from the first support 100. The foothold supporting part 400 is supported to the main frame 40 by the connection part 120.

Accordingly, the arranged state of the foothold for checking 30 may be differentiated by the vertical moving arrangement and angle moving arrangement of the connection part 120.

The foothold supporting part 400 has the same structure as the first support 100. In other words, the foothold supporting part 400 includes a supporting protrusion 410 supporting the foothold and a wire supporting portion 411 provided under the supporting protrusion.

The configuration of the connection part 120 supporting the foothold supporting part 400 and the main frame 40 is the same as the configuration of the connection part 120 connected with the first support 100.

In other words, the connection part 120 includes an upper supporting member 130 coupled to the foothold supporting part 400 and a lower supporting member 140 connected to the main frame 40.

The upper supporting member 130 includes the bracket 131 coupled to the foothold supporting part 400 and the connecting bar 136 coupled to the bracket 131. The hollow portion 136a is formed in the connecting bar 136.

The lower supporting member 140 includes a body portion 141 having an arc-shaped guide groove 141a and a seated portion 142 seated in the main frame 40.

The body portion 141 and the connecting bar 136 are coupled to each other by a fastening member (not shown) such as a screw and the height of the connecting bar 136 is adjusted according to the fastening between the hollow portion 136a and the fastening member after the relative movement, only to adjust the height of the foothold for checking 30.

The arrangement angle of the connecting bar 136 is adjusted according to the fastening between the guide groove 141a and the fastening member after the relative movement, only to adjust the arrangement angle of the foothold for checking 30.

Even in this instance, the foothold supporting part 400 is arranged in a back and force direction of the foothold for checking 30, to face the foothold for checking 30.

FIG. 13(a) is a diagram the connection wire 250 connected to a top of the column portion 210 by the wire connecting portion 250. FIG. 13(b) is an exploded perspective view of components forming such the connection state.

As shown in FIGS. 13(a) and 13(b), the wire connecting portion 260 provided in the top of the column portion 210 is an eye bolt. A fastening hole 211 is provided in the portion where the eye bolt is fastened and a female screw thread is formed in the fastening hole 211.

The plurality of the fastening holes 211 may be formed in an outer circumferential surface of the column portion 210, to provide various installation positions of the wire connecting portion 260.

Accordingly, another fastening hole 211 may be provided except the fastening hole 211 fastened to the wire connecting portion 260. If such the fastening hole 211 is left as it is, rain or snow might penetrate into the column portion 210 and the inside of the column portion might corrode.

To prevent such corrosion, a small covering member 212 such as lit or a cap may be coupled to the fastening hole 211 to prevent moisture from penetrating into the fastening hole 211.

Here, the wire connecting portion 270 may be an eye nut and a bolt portion may be arranged in the portion where the eye nut is coupled.

Figure 14:
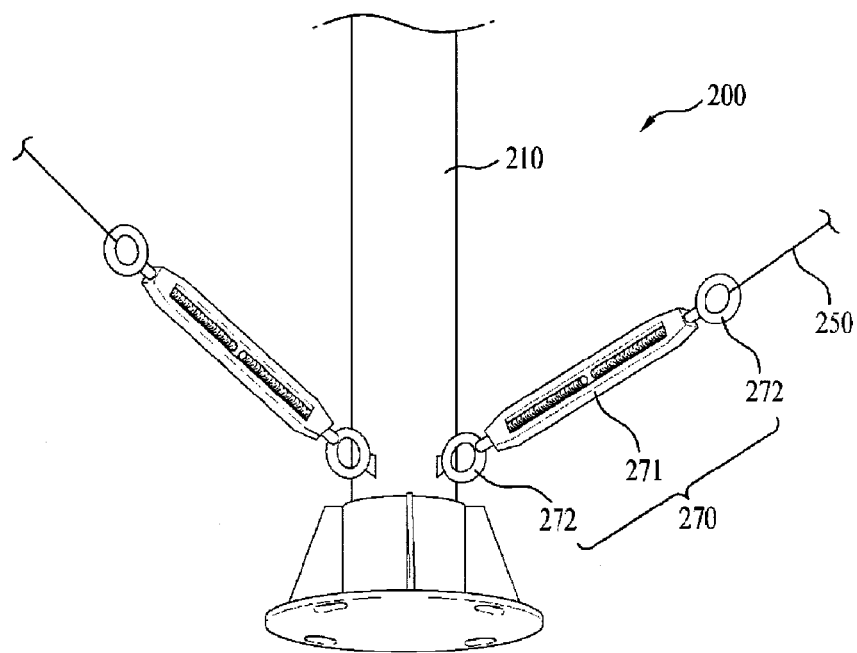
FIG. 14 is a perspective view illustrating a wire connected to a wire tension adjusting member of the support structure.
Figure 14:
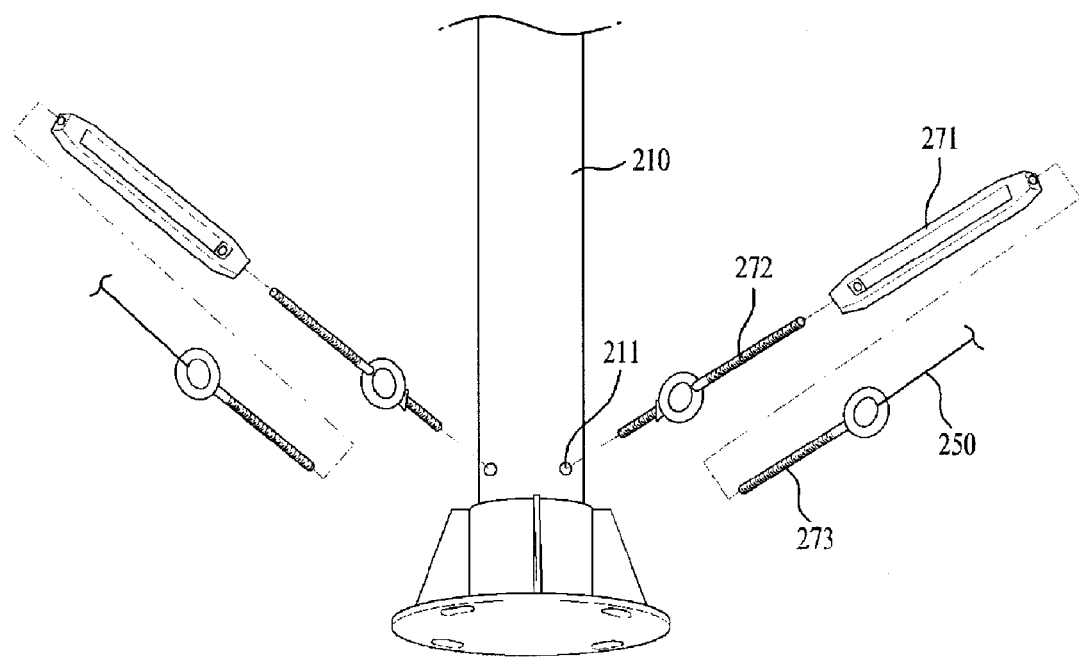

FIGS. 14(a) and 14(b) show that the turn buckle 270 is provided in the column portion 210 as the wire tension adjusting member to adjust the tension of the connection wire 250.

The turn buckle 270 includes a rotary nut 271 and first and second bolts 272 and 273 coupled to both ends of the rotary nut 271.

The first bolt 272 is coupled to an outer circumferential surface of the lower portion of the column portion 210 and the second bolt 273 is connected to the connection wire.

After coupling the turn buckle 270 having the connection wire 250 connected thereto to the column portion 210, an assembling worker rotates the rotary nut 271 and the gap between the first bolt 272 and the second bolt 273 is getting narrower, to reinforce the tension of the connection wire 250.

The connection wire 250 connects one second support 200 to the other second support 200, such that the supporting state of the second supports 200 can be reinforced.

Figure 15:
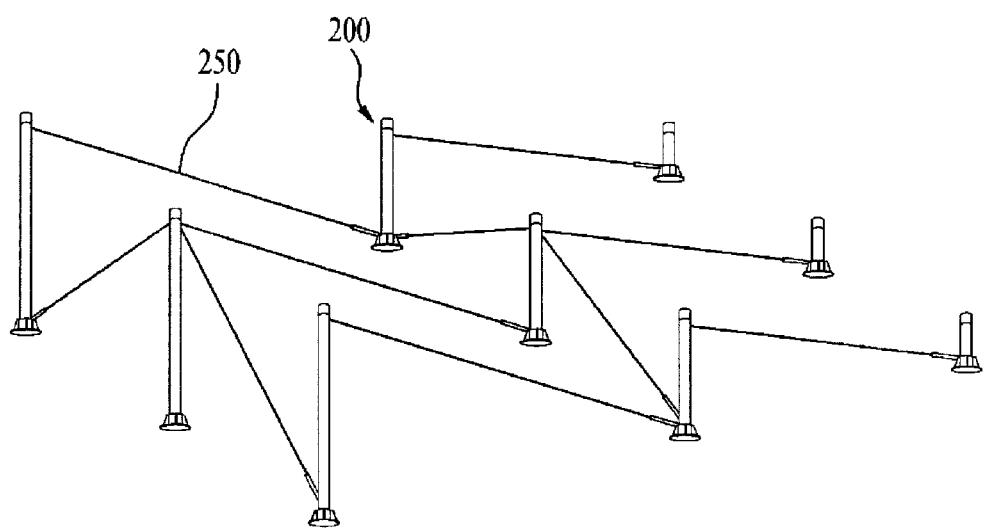
FIG. 15 is a perspective view illustrating second supports connected with each other by a connection wire in the support structure.

FIG. 15 is a diagram the second supports 200 connected with each other, spaced apart a predetermined distance.

One second support 200 is connected with another second support 200, to prevent a specific second support 200 from falling after shaking in a right and left direction.

Figure 16:
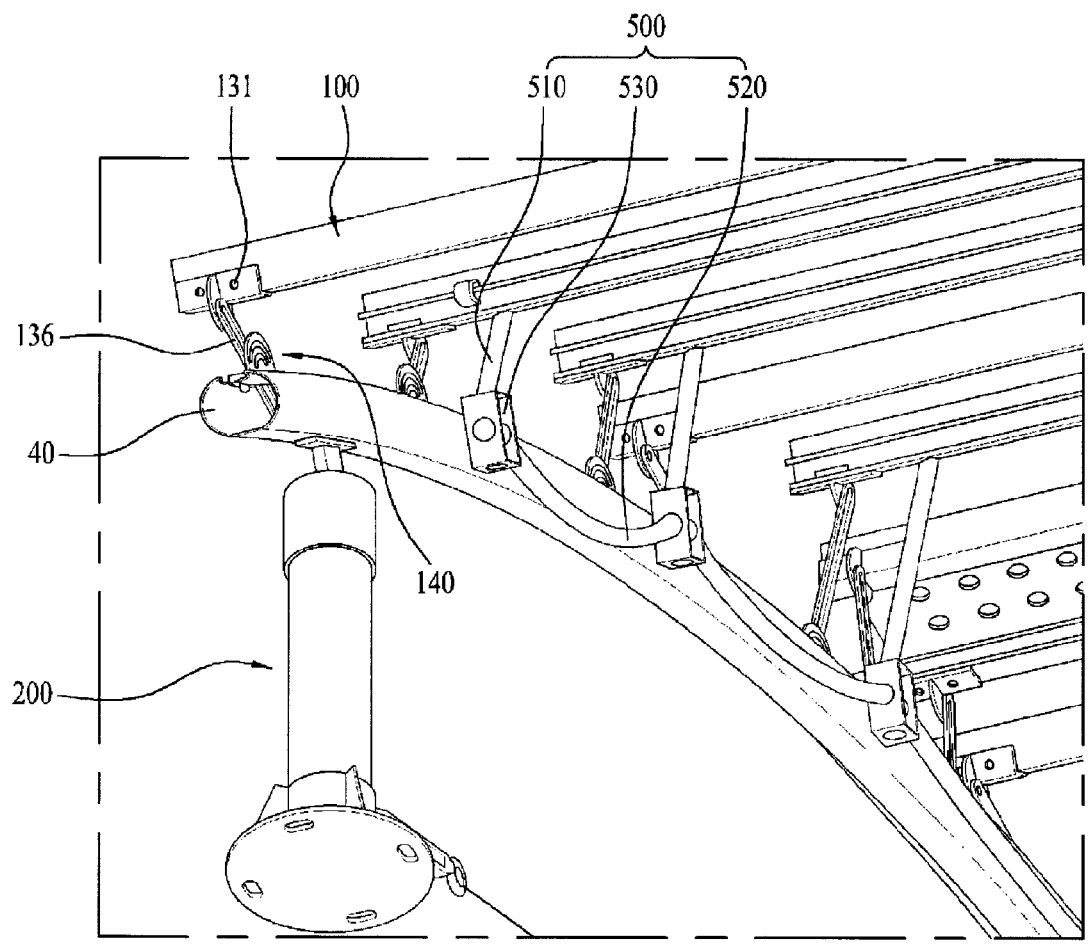
FIGS. 16 and 17 are perspective views illustrating an auxiliary wiring pipe and a main wiring pipe provided in the support structure.
Figure 17:
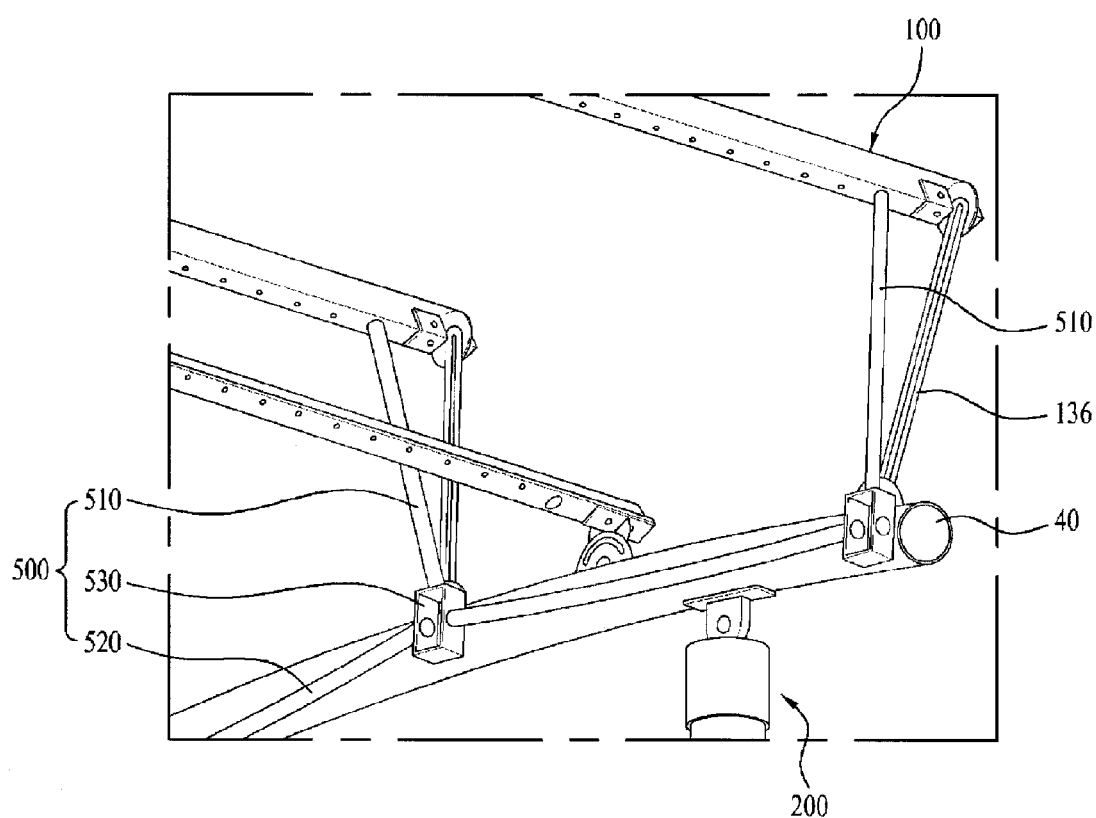

As shown in FIGS. 16 and 17, an electric wiring pipe 500 is provided in a lower portion of the first support 100 to prevent and accommodate the electric wires extended downward.

The electric wiring pipe 500 includes an auxiliary wiring pipe 510 connected to the first support 100, with being extended downward, and a main wiring pipe 520 connected with the auxiliary wiring pipe 510 to accommodate main wires where wires accommodated by the auxiliary wiring pipe 510 join.

The auxiliary wiring pipe 510 and the main wiring pipe 520 are connected with each other by a pipe connecting hole 530.

The auxiliary wiring pipe 510 is extended from a lower portion of the first support 100 downward. The auxiliary wiring pipe 510 may be arranged adjacent to the connecting bar 136. The main wiring pipe 520 may be arranged along the main frame 40 vertically.

Here, the main wiring pipe 520 or the auxiliary wiring pipe 510 may be flexible pipes, considering length adjustment or movement generated by the wind, and the present invention is not limited thereto.

Meanwhile, a rear end is formed higher than a front end of the solar cell module 10. Accordingly, the first support 100 supporting the front end of the solar cell module 10 is supported by the bracket 131 and the bracket 131 may be directly connected to the lower supporting member 140.

Meanwhile, the first support supporting the rear end of the solar cell module 10 is supported by the bracket and the bracket 131 is connected to the connecting bar 136. The connecting bar 136 may be connected to the lower supporting member 140.

Figure 18:
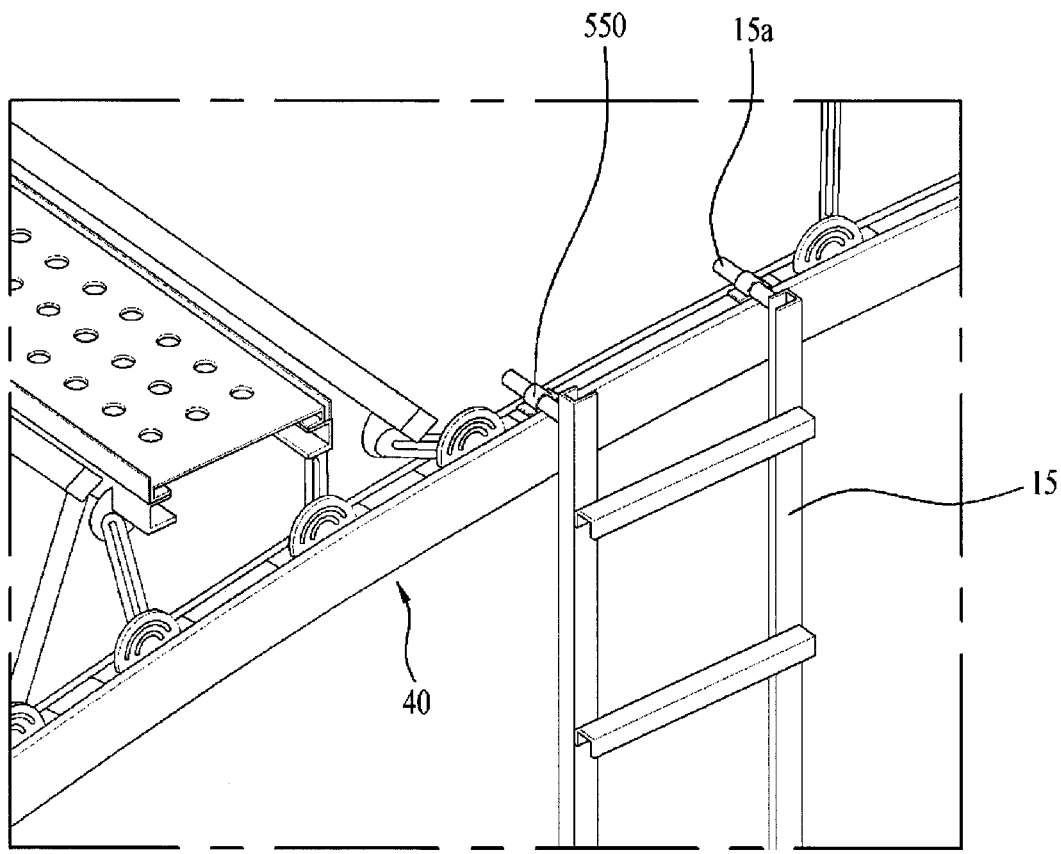
FIG. 18 is a perspective view illustrating a ladder for checking mounted in the support structure.
Figure 19:
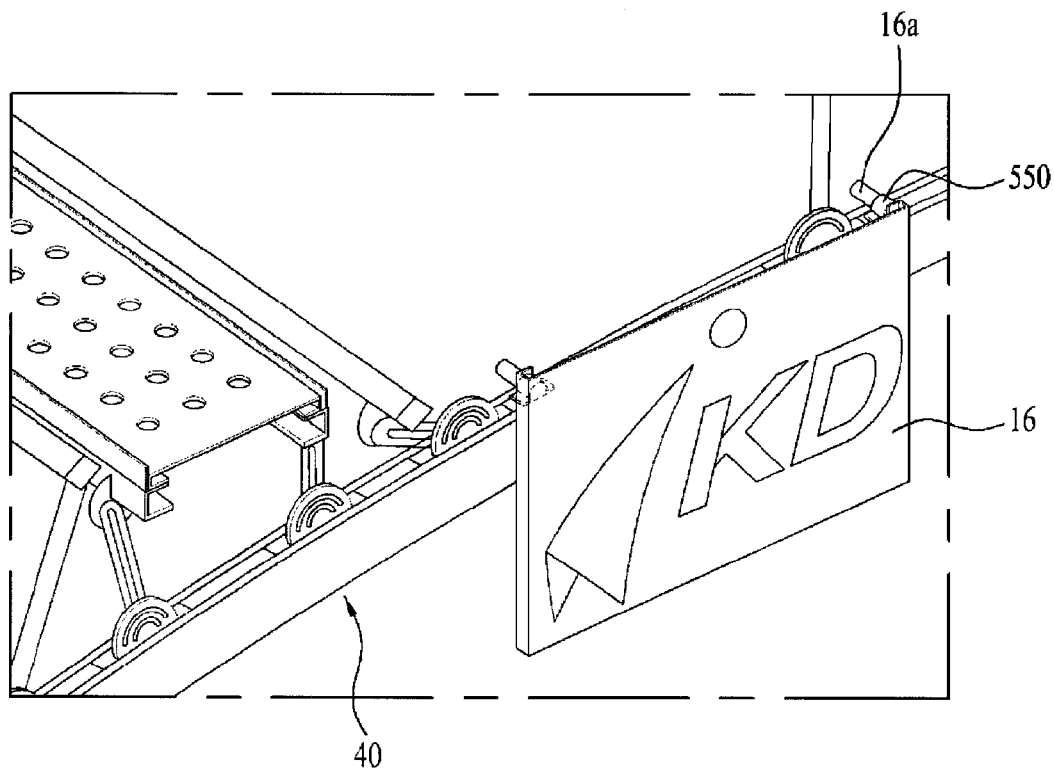
FIG. 19 is a perspective view illustrating a sign mounted in the support structure.
Figure 20:
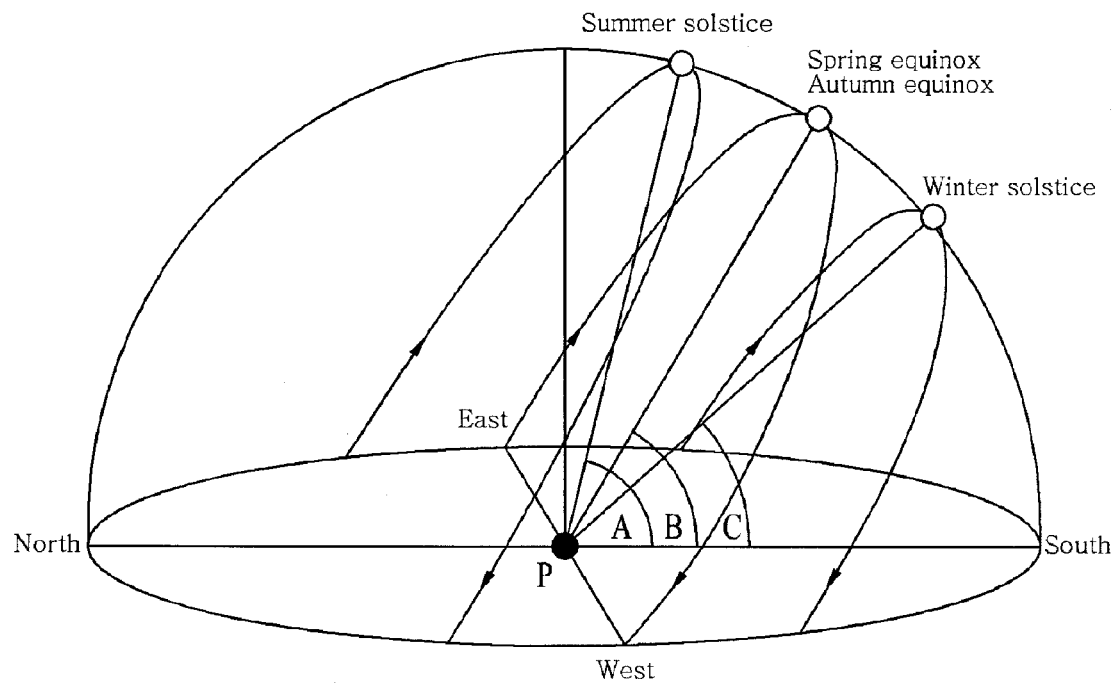
FIG. 20 is a diagram illustrating the solar altitude for each solar term.

FIGS. 18 and 19 illustrate a ladder 15 or a sign 16 provided in the main frame 40.

Here, a holder 550 is provided in the main frame 40 to hold the ladder for checking 15 or the sing 16. A fixing material 15a or 16a may be provided in the ladder for checking 15 or the sign 16, to fixedly inserted in the holder 550.

Referring to the accompanying drawings, the operation of the present invention will be described as follows.

The solar altitude is differentiated according to solar terms.

Specifically, the irradiation time of the sun is short and the solar altitude (C) is low in winter. The irradiation time of the sun is long and the altitude is high in spring and autumn.

In summer, the irradiation time of the sun is the longest among four seasons and the solar altitude is the highest.

In this instance, it is necessary to enlarge a tilted angle of the solar cell module with respect to the ground so as to collect more light of the sun in winter having the low altitude.

In opposite, the solar altitude is high and the light of the sun is almost perpendicularly beating in summer, compared with spring/autumn and winter.

Accordingly, it is necessary to reduce the tilted angle of the solar cell module with respect to the ground in summer, compared with the other seasons.

When the season is changed into summer, as shown in FIG. 9, it is necessary for the worker to heighten the front end or lower the rear end of the solar cell module 10 as the arrangement tilted angle with respect to the horizontal plane of the solar cell module 10 is getting smaller.

To height the first support 100 supporting the front end of the solar cell module 10, it is necessary to heighten the connecting bar 136 as much as be projected upward from the main frame (A state)

At this time, the height of the first support 100 supporting the rear end of the solar cell module 10 may not be adjusted or rarely adjusted.

To lower the first support 100 supporting the rear end of the solar cell module 10, the connecting bar 136 is lowered not to be projected from the main frame 40 and it is moved downward.

At this time, the height of the first support 100 supporting the front end of the solar cell module 10 may not be adjusted or rarely adjusted.

Meanwhile, when the season is changed into winter, the solar altitude is lowered and it is necessary for the worker to lower the front end or heighten the rear end of the solar cell module 10 to enlarge the arrangement tilted angle of the solar cell module 10 as shown in FIG. 9.

Accordingly, to reduce the height of the first support supporting the front end of the solar cell module 10, the connecting bar 136 is not projected higher than the main frame 40 and the connecting bar 136 is moved downward. (B state).

At this time, the height of the first support 100 may not be adjusted or rarely adjusted.

In addition, to enlarge the height of the first support 100 supporting the rear end of the solar cell module 10, the connecting bar 136 is not projected higher than the main frame 40 and it is moved upward.

Even in this instance, the height of the first support 100 may not be adjusted or rarely adjusted.

Meanwhile, even when the season is changed from winter into summer or vice versa, the connecting bar 136 is relatively rotated with respect to the body portion 141 of the lower supporting member 140 and after that, it is fastened to adjust the arrangement angle of the solar cell module 10 and to maximize light collection intensity and power generation according to characteristics of each season.

[Industrial Applicability]

According to the solar cell module support structure, the back and force movement of the solar cell module is adjusted along the main frame efficiently to adjust the distance spaced apart between the solar cell modules. Accordingly, ventilation efficiency can be enhanced and light collection efficiency of the solar cell module can be enhanced. As a result, the solar cell module support structure can be applied to a solar cell having various structures and shapes.

Then invention claimed is:

1. A solar cell module support structure comprising:
a first support seating a solar cell module therein to support;
a connection part connected to the first support;
a main frame connected to the connection part to support the solar cell module and the first support, the main frame comprising an installation groove formed along a longitudinal direction to install the connection part herein to adjust a position of the connection part along a longitudinal direction;
a second support provided in a lower portion of the main frame, a plurality of second supports spaced apart a predetermined distance from each other;
a connection wire connecting one of the second supports with another second support; and
a coupling part coupling the second support and the main frame to each other, wherein the coupling part comprises:

a first coupling portion coupled to a bottom surface of the main frame to be fastened to the first support;
a second coupling portion coupled to a top surface of the main frame; and
a fastening bolt arranged via the main frame to connect the first coupling portion and the second coupling portion with each other.

2. The solar cell module support structure according to claim 1, further comprising:
a wire connecting portion coupled to an outer circumferential surface of a specific second support, having an end of the connection wire connected thereto; and
a wire tension adjusting portion coupled to an outer circumferential surface of another second support, having the other end of the connection wire connected thereto, to adjust a tension of the connection wire.

3. The solar cell module support structure according to claim 2, the wire connecting portion is an eye nut or an eye bolt fastened to the second support part, and
the wire tension adjusting portion is a turn buckle.

4. The solar cell module support structure according to claim 1, the second coupling portion is arranged in an installation groove of the main frame.

5. The solar cell module support structure according to claim 1, the first support comprises,
a column portion;
an upper supporting portion provided in an upper portion of the column portion, being connected to the first coupling portion; and
a lower supporting portion provided in a lower portion of the column portion, being connectable with an anchor bolt provided in the ground.

6. The solar cell module support structure according to claim 5, wherein the second coupling portion comprises,
a plurality of coupling plates spaced apart a predetermined distance from each other; and
an extended portion extended from a top surface of the upper supporting portion to be inserted between the coupling plates, the extended portion coupled to the coupling plates by a predetermined fastening member.

7. The solar cell module support structure according to claim 1, wherein a plurality of connection parts are provided to support front and rear ends of the solar cell module, respectively, and
the coupling part is arranged between one connection part supporting the front end of the solar cell module and another connection part supporting the rear end of the solar cell module.

8. The solar cell module support structure according to claim 1, wherein the connection part comprises,
an upper connection member connected to the first support; and
a lower connection member connected to the upper connection member and the installation groove of the main frame to support the upper connection member having an arrangement angle and an arrangement height at least one of which is adjusted.

9. The solar cell module support structure according to claim 8, the main frame further comprises,
a hollow portion provided in a lower portion of the installation groove to insert the upper connection member therein.

10. The solar cell module support structure according to claim 8, the upper connection member comprises,
a bracket coupled to the first support;
a connecting bar coupled to the bracket and the lower connection member, the connecting bar comprising a hollow portion formed therein longitudinally to guide adjusting of the height of the solar cell module and the first support.

11. The solar cell module support structure according to claim 8, wherein the lower connection member comprises,
a body portion;
a guide groove provided in the body portion to insert the fastening member fastening the connecting bar to adjust an arrangement angle of the connecting bar; and
a seated portion provided in a lower portion of the body seated in a lower portion of the body portion to be seated in the installation part of the main frame.

12. The solar cell module support structure according to claim 11, wherein a plurality of guide grooves are provided in columns and each of the guide grooves is formed in an arc-shape corresponding to a locus of the connecting bar.

13. The solar cell module support structure according to claim 10, further comprising a fastening member fastening the seated portion to the main frame,
wherein the fastening member comprises,
a head portion inserted in the installation groove, with both ends supporting a bottom surface of a rim of the installation groove; and
a fastening bolt connected to the head portion, the fastening bolt comprising a screw thread fastened to a fixing bolt via the seated portion.

14. The solar cell module support structure according to claim 13, further comprising:
a projected portion extended from a rim of the installation groove provided in the main frame downward to contact and support the head portion.

15. The solar cell module support structure according to claim 8, wherein the first support comprises,
a supporting protrusion supporting the solar cell module; and
a fixing portion fixing the solar cell module thereto, wherein
the fixing portion comprises:
a body portion surrounding a rim of the solar cell module and the supporting protrusion, when the solar cell module is seated in the first support; and
a fixing bolt fastened to the body portion, with an end contactable with the supporting protrusion to fix the solar cell module to the first support.

16. The solar cell module support structure according to claim 15, wherein the body portion is provided in a '⊂' shape, and
an upper portion of the body portion is provided to surface-contact with a rim of the solar cell module and a lower portion of the body portion comprises an inserting hole formed therein to screw-fasten the fixing bolt thereto.

17. The solar cell module support structure according to claim 16, wherein a projected portion is provided in a bottom surface of the upper portion of the body portion to contact with the rim of the solar cell module 18. The solar cell module support structure according to claim 15, wherein a plurality of fixing portions are arranged part in the first support, spaced apart a predetermined distance from each other, to fix the solar cell module to the first support.

19. The solar cell module support structure according to claim 8, further comprising:
a foothold supporting part supporting a foothold.

20. The solar cell module support structure according to claim 8, further comprising:
an auxiliary wiring pipe extended from the first support downward to be connected to the solar cell module;

a main wiring pipe arranged in a predetermined portion of the main frame, being connected to the auxiliary wiring pipe, to accommodate a main wire joining a wire connected to the solar cell module; and a wiring pipe connection hole connecting the auxiliary wiring pipe and the main wiring pipe with each other.

21. The solar cell module support structure according to claim 8, further comprising:

a holder provided in the main frame to hold a ladder and a sign.

22. The solar cell module support structure according to claim 8, wherein the one first support supporting a specific solar cell module is spaced apart a predetermined distance from another first support supporting a neighboring solar cell module to generate a predetermined space for air ventilation between a specific solar cell module and a neighboring solar cell module.

* * * * *